United States Patent [19]
Fujimoto

[11] Patent Number: 5,974,575
[45] Date of Patent: Oct. 26, 1999

[54] SIMULATION DEVICE AND METHOD

[75] Inventor: Kiyoshi Fujimoto, Tokyo, Japan

[73] Assignee: NEC Corporation, Tokyo, Japan

[21] Appl. No.: 09/100,395

[22] Filed: Jun. 19, 1998

Related U.S. Application Data

[63] Continuation of application No. 08/752,286, Nov. 19, 1996, abandoned.

[30] Foreign Application Priority Data

Nov. 29, 1995  [JP]  Japan ................................. 7-311230

[51] Int. Cl.$^6$ ............................... G06K 5/04; G11B 5/00
[52] U.S. Cl. ......................................................... 714/700
[58] Field of Search ................................. 371/1; 714/700

[56] References Cited

U.S. PATENT DOCUMENTS 5,650,947  7/1997  Okumura ................................. 364/578

FOREIGN PATENT DOCUMENTS 5-189517  7/1993  Japan.

Primary Examiner—Phung M. Chung
Attorney, Agent, or Firm—Foley & Lardner

[57] ABSTRACT

The simulation device and method exhaustively checks for the influence of skew in external input signals caused by numerous instances of unspecified tester skew to prevent testing problems when testing ICs such as ASIC before shipment. The simulation device is provided with a sequential circuit detection processor 1 that detects all first-stage sequential circuit elements 17 that may be affected by tester skew and outputs sequential circuit element information, a skew value library 4 for simulation use to which is added tester skew value fluctuation, and a data substitution section 3 that directs operation execution to an arithmetic section 6, transcribes prescribed data of the skew value library 4 to a normal library 5, and substitutes data of a net list 7.

4 Claims, 6 Drawing Sheets $t$ SET-UP: $\alpha$ OF SEQUENTIAL CIRCUIT 20

$t_{SET-UP}$: $(2\beta + \alpha)$ OF SEQUENTIAL CIRCUIT 17

SIMULATION DEVICE AND METHOD

This application is a continuation of 08/752,286 filed on Nov. 19, 1996, which is now abandoned.

BACKGROUND OF THE INVENTION

1. Field of the Invention

The present invention relates to a device and method for simulation, and particularly to a testing method and associated simulation device for testing semiconductor integrated circuits such as application-specific integrated circuits (ASIC) that include logic circuits.

2. Description of the Related Art

Logic verification for confirming the correctness of logic circuits is crucial in designing semiconductor integrated circuits such as ASIC. Logic verification methods that use logic simulation have come into widespread use with increases in circuit integration.

Logic simulation is performed by inputting simulation execution control data and descriptions of the logic circuit under design in design language and outputting a resulting time chart that represents the operation. By validating the content of the time chart, designers can confirm the correctness of operation of the logic circuit. Simulation devices for ASIC now in use employ a cyclic simulation test pattern in which expected values are inputted to an LSI tester for each cycle and can verify automatically by comparing expected values with simulation results to determine automatically whether or not simulation results coincide with the designers' expected values.

However, in such prior-art simulation devices for ASIC, tester skew, i.e., the timing difference between a tester's electrical input signals, has not been taken into due consideration, and this tester skew frequently gives rise to the problem that some types of ASIC products may pass simulation tests but then fail tests at the time of shipment.

Referring to FIG. 1, which shows a block diagram of a first simulation device typical of this type of the prior art, such a prior-art simulation device is provided with arithmetic section 6 that reads net list 7, which is circuit connection information, test patterns 8, and library 19 specifying delay times and timing of elements, and performs logic operations and timing verification; and memory section 2 that holds the operation results of arithmetic section 6.

As to the simulation method, i.e., the operation of the prior-art simulation device, referring to FIG. 1, FIG. 2(A) shows one example of a circuit for simulation, and FIG. 2(B) shows a timing chart for the circuit, the object circuit for simulation includes data signal input terminal 13 that inputs data signals of the object process; control signal input terminal 14 that inputs control signals such as clock pulses; data-side combinatory logic 15 that combines data-system signals by a prescribed logic and outputs data signals d; control-side combinatory logic 16 that combines control-system signals by a prescribed logic and outputs control signals c; first-stage sequential circuit element 20 that operates in response to the supply of each of data signals d and control signals c to input terminal $D_1$ and $C_1$, respectively, and outputs output signals q from output terminal $Q_1$; and second-stage sequential circuit element 18 that is of the same type as sequential circuit element 20, that operates in response to the supply of each of signals q and control signals c to input terminals $D_2$ and $C_2$, respectively, and that outputs output signals qq to an internal circuit from output terminal $Q_2$.

Even for this type of circuit structure, the simulation method of the prior art converts to a library the timing specifications for operation characteristics that elements should satisfy, which in this case are set-up times (hereinafter referred to as "$t_{set-up}$"), uniformly for first-stage sequential circuit element 20 and second-stage sequential circuit element 18, and judges internal timing and output logic with respect to this library.

Referring to FIG. 2(B), set-up time $t_{set-up}$ is the time interval from the rising edge of a data input signal to data signal input terminals $D_1$ and $D_2$ to the rising edge of a control input signal to control signal input terminal $C_1$ and $C_2$ for sequential circuit elements 18 and 20, and this time interval is established as a prescribed value $\alpha$.

This shows that during simulation, these circuits operate correctly if $t_{set-up} \geq \alpha$ for both sequential circuit elements 18 and 20, but that there is a possibility for malfunctioning of these circuits if timing $t_{set-up} < \alpha$ for both or either of sequential circuit element 18 and 20.

Accordingly, the first simulation method of the prior art allows correct judging of circuit operation for an ideal state in which absolutely no skew occurs in the input signals to data-system input terminal 13 and control-system input terminal 14. This is because judgment of timing is based on the characteristics of the elements for both sequential circuit element 20 of the first stage, which may be affected by tester skew during testing at the time of shipping, as well as for sequential circuit element 18 positioned in a subsequent stage. In a non-ideal case, however, in which skew occurs in input signals to terminals 13 and 14, there is a possibility that, despite satisfactory simulation results, an article will be misjudged as defective at the time of shipping due to a timing relation whereby $t_{set-up} < \alpha$.

A second simulation device described in Japanese Patent Laid-open No. 189517/93 is directed toward eliminating the above-described disparity in operation between testers, i.e., circuit malfunctioning due to differences in testers. This second simulation device achieves this object of preventing circuit malfunctioning due to tester differences by determining in advance specific clock signals and data signals, generating an alarm meaning undefined level only for these specific data signals when the timing of these input signals is in a fixed conflict state, and then designing circuits subject to verification such that this undefined level is not generated.

However, this device cannot freely detect conflict states between numerous unspecified clock signals and data signals.

In the above-described first simulation device and method of the prior art, the timing specifications of all sequential circuit elements within a circuit are uniformly defined as specific values that an element should satisfy, and timing or output logic of internal sequential circuit element sections is then judged using this library as a standard. As a result, the first simulation device and method have the drawback that, even for a circuit in which exist many unspecified sequential circuit elements that directly receive the effect of skew between data-system input signals and control-system input signals, timing judgment that takes into consideration the effect of external skew, which properly should be considered with respect to these sequential circuit elements, is not enabled. This inability to exhaustively detect possibilities of circuit malfunctioning due to tester skew arising from the combination of unspecified inputs during testing at the time of shipping results in the drawback that problems in testing at the time of shipping cannot be prevented.

In addition, the second simulation device of the prior art, although directed toward the prevention of circuit malfunctioning due to differences between testers, also suffers from the drawback of limited use because it does not freely detect conflict states between numerous unspecified clock signals and data signals.

SUMMARY OF THE INVENTION

The object of the present invention is to provide a simulation device and method that, through exhaustive checking by simulating the effect of skew between external input signals, can prevent problems relating to the occurrence of malfunctions in testing upon shipping of ASIC that arise from numerous unspecified tester skew.

To achieve the above-described object, the simulation device of the present invention includes:

for the purpose of verifying test logic operations of a logic circuit in response to the supply of predetermined test patterns, the logic circuit containing: a data input circuit that inputs data input signals, combines the data input signals through a prescribed logic circuit, and outputs data signals; a control input circuit that inputs control input signals including clocks, combines the control input signals through a prescribed logic circuit, and outputs control signals; and at least one stage of cascade-connected sequential circuit elements that performs logic operations in accordance with the supply of the data signals and control signals and outputs logic output signals;

a net list, which is circuit connection information of the logic circuit; and arithmetic means which includes logic operation and timing verification, which reads the test patterns containing the data input signals and control input signals, and which reads a library specifying delay times and timing of circuit elements;

and further includes:

sequential circuit detection processing means that detects all of first-stage sequential circuit elements that directly receive the supply of data input signals and control input signals and that outputs sequential circuit element information;

a skew value library for simulation use to which is added skew value fluctuation, which is the disparities of skew values for each tester, which are in turn differences in timing between the data input signals and control input signals outputted by testers; and data substitution means for directing operation execution to the arithmetic means transcribing prescribed data of the skew value library to the library, and substitutes data of the net list.

In addition, another modification of the simulation device of the present invention includes:

net list trace-back processing means that individually selecting first-stage sequential circuit elements included in the sequential circuit element information and moreover, tracing back the net list in the direction of the input circuit of the logic circuit from the input terminal of a selected sequential circuit element;

path delay calculation means for calculating path delay as far as the corresponding input terminals of the input circuit for each path of the data input signals and the control input signals specified by the net list trace-back processing means;

skew judging means for comparing each of the path delay values of the data input signals and control input signals calculated by the path delay calculation means for all of the combinations of the data input signals and control input signals; and error information output means for displaying each input circuit name and differences in delay between input circuits for combinations of the data input signals and control input signals judged by the skew judging means to have no tester skew margin.

In addition, the simulation method of the present invention:

verifies test logic operations of a logic circuit in response to the supply of predetermined test patterns, the logic circuit containing: a data input circuit that inputs data input signals, combines the data input signals through a prescribed logic circuit, and outputs data signals; a control input circuit that inputs control input signals including clocks, combines the control input signals by a prescribed logic circuit, and outputs control signals; and at least one stage of cascade-connected sequential circuit elements that performs logic operations in accordance with the supply of the data input signals and control input signals and outputs logic output signals; the simulation method further including:

a first step of designating all input circuits containing the data input circuits and the control input circuits from a net list which is circuit connection information of the logic circuits;

a second step of detecting a first-stage sequential circuit elements by tracing the net name of all of the input circuits and checking the type of circuit element of the next succeeding stage of each of all input circuits;

a third step of generating first-stage sequential circuit information containing the element type and element name of the first-stage sequential circuit elements in accordance with detection of the first-stage sequential circuit elements;

a fourth step of generating first-stage skew value element data by altering the first-stage sequential circuit information to data names of a skew value library, which is a library containing predetermined skew value fluctuations, which are disparities in skew value for each tester, these disparities in skew value being differences in timing between the data input signals and control input signals outputted by testers, and storing this first-stage skew value element data in the skew value library;

a fifth step of extracting only the first-stage skew value element data from the skew value library, transcribing the first-stage skew value element data by copying to a normal library which is a library for normal simulation use, and generating a first-stage skew value library; and a sixth step of substituting for the first-stage skew value library name a first-stage sequential circuit element specifying a first-stage sequential circuit element corresponding to element names matching the first-stage sequential circuit information on the net list, and executing simulation.

In addition, another modification of the simulation method of the present invention further includes:

a seventh step of generating the selected circuit element by selecting one first-stage sequential circuit element among first-stage sequential circuit information generated in the third step;

an eighth step of specifying data signal path and control signal path reaching respective external input terminals by tracing back the net list from each of the input terminals of the data signals and control signals of the selected circuit element; and a ninth step of calculating delay values of each path of data input signal and control input signal of the data input signal paths and control input signal paths, and judging whether the differences between delay values of each path of these data input signals and control input signals are within the skew value fluctuation.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
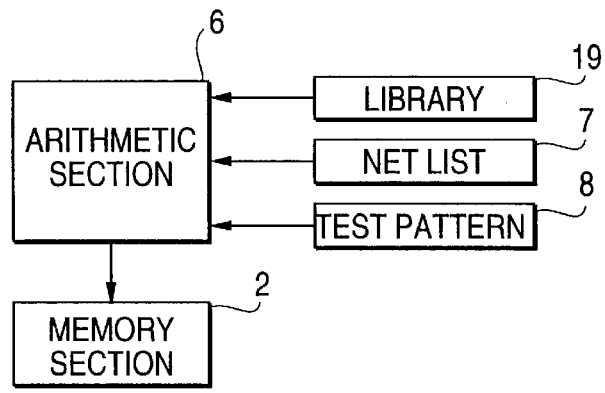
FIG. 1 is a block diagram showing one example of a simulation device of the prior art.
Figure 2A:
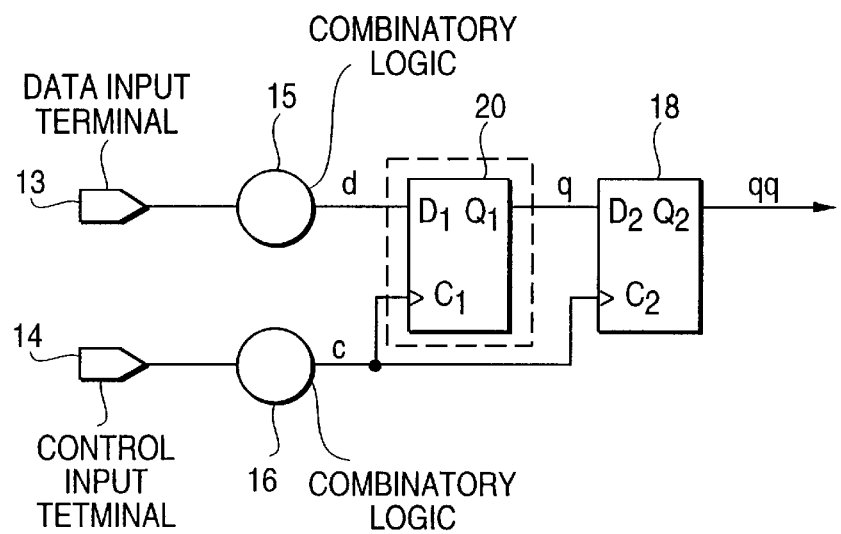
FIG. 2(A) is a block diagram of one example of an object circuit for simulation by the prior-art example shown in FIG. 1.
Figure 2B:
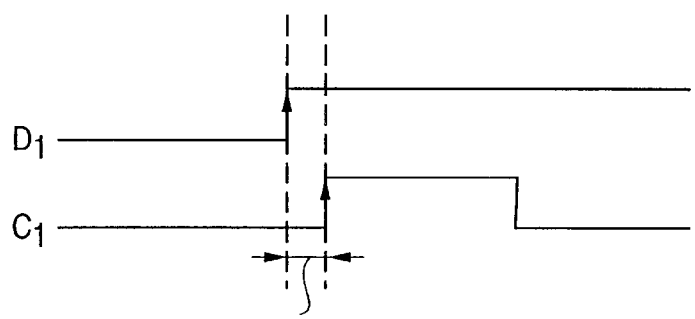
FIG. 2(B) is a figure illustrating timing specifications for this circuit.
Figure 3:
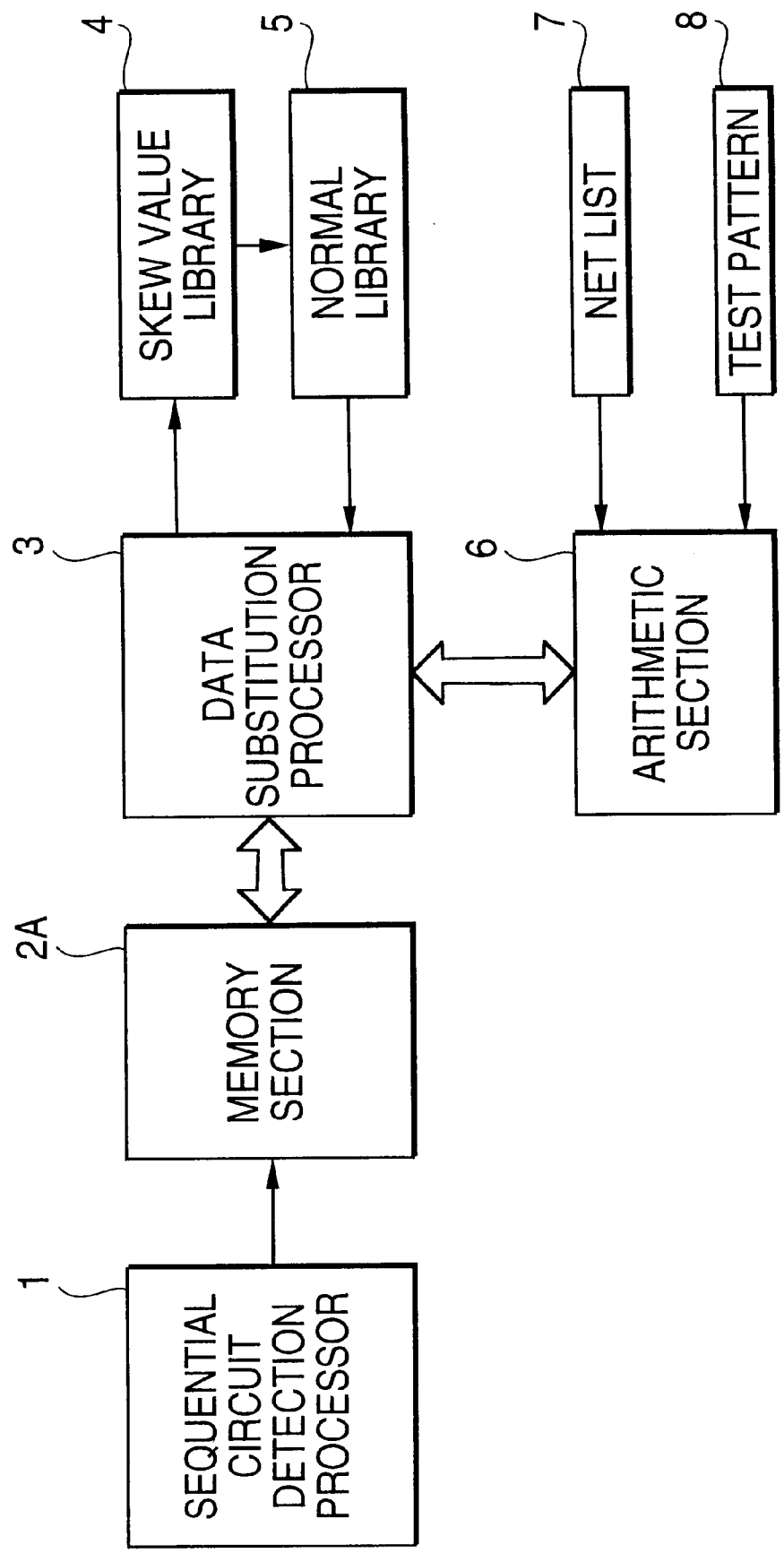
FIG. 3 is a block diagram showing the first embodiment of the simulation device of the present invention.

Embodiments of the present invention will next be explained with reference to the accompanying figures. FIG. 3 is a block diagram showing the first embodiment of the simulation device of the present invention.

As with the prior-art example, this simulation device includes arithmetic section 6, net list 7, and test pattern 8; and furthermore includes: sequential circuit detection processor 1 that detects all first-stage sequential circuit elements, i.e., internal sequential circuit elements directly connected to data-system input and control-system input from the outside by way of combinatory logic, and that outputs sequential circuit element information; memory section 2A that stores sequential circuit element information, data processing results, and operation results; skew value library 4 for simulation use containing tester skew value fluctuations, i.e., disparities in tester skew; normal library 5 for normal simulation use; and data substitution processor 3 that performs reading and writing of data processing results to memory section 2A, directs operation execution to arithmetic section 6, transmits only necessary skew value library to normal library 5, and performs data substitution of the net list.

By means of this construction, the present embodiment detects at the circuit verification stage all timing factors that can potentially cause malfunctioning due to the effects of tester skew value fluctuations by first tracing and extracting for all input paths of a circuit all first-stage sequential circuit elements located on the input side that have a possibility of being affected by tester skew, and moreover, executing simulation by substituting only extracted first-stage sequential circuit elements with a skew value library that takes into consideration tester skew value fluctuations.

Figure 5A:
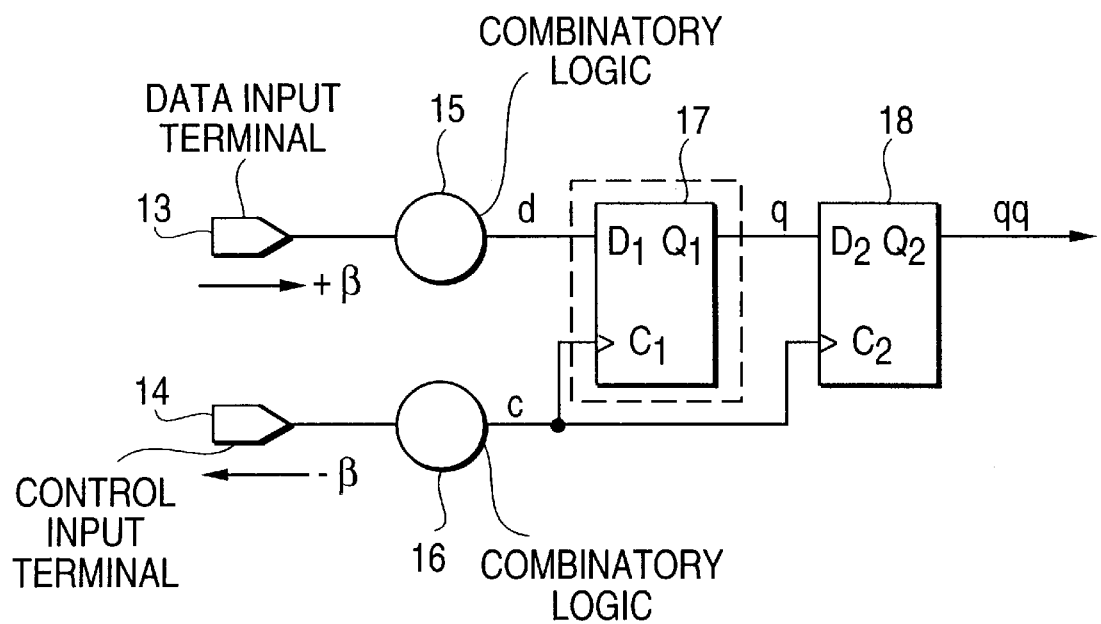
FIG. 5(A) is a block diagram showing an object circuit for simulation by the first embodiment.
Figure 5B:
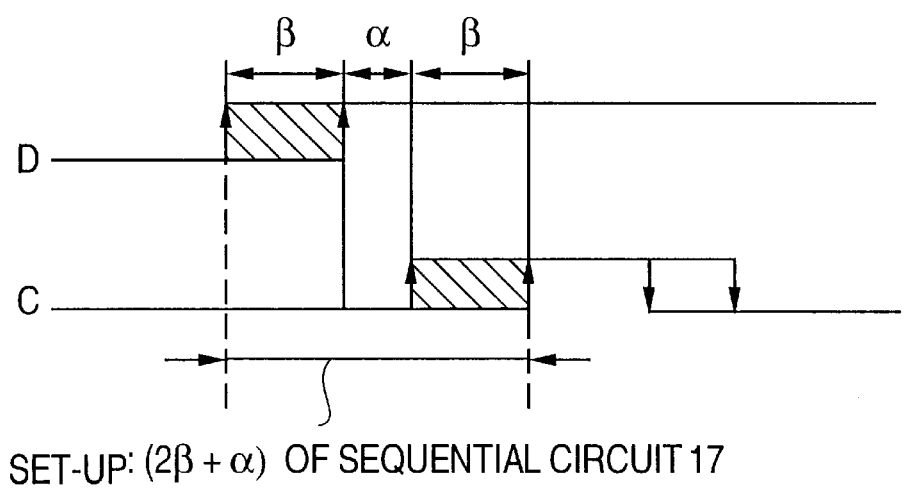
FIG. 5(B) is a chart illustrating the timing specifications for this circuit.

Referring to FIGS. 5(A) and 5(B) which respectively show one example of an object logic circuit for simulation by the present embodiment and a timing specification chart, FIG. 5(A) shows the object circuit for simulation which has, as for the prior-art example, data signal input terminal 13, control signal input terminal 14, data-side combinatory logic 15 for outputting data signals d, and control-side combinatory logic 16 for outputting control signals c, and sequential circuit element 18. In place of first-stage sequential circuit element 20 of the prior-art example, however, the object circuit in FIG. 5(A) is provided with first-stage skew value sequential circuit element 17 which adds fluctuation range values appropriate to the amount of fluctuation of set-up times corresponding to tester skew (to be explained) to the timing specifications of each of input terminals D and C and, in response to supply of each of data signals d and control signals c, respectively, operates and outputs output signals q from output terminal Q.

The operation of the present embodiment will next be explained with reference to FIG. 3, FIG. 4, which shows the processing procedures in a flow chart, and FIGS. 5(A) and 5(B). First, all input terminals including each data signal or control signal input terminals 13 and 14 are selected from net list 7, which is circuit connection information (Step 201). The net names of all input terminals are then immediately traced, and the element type of the next stage succeeding all input terminals is checked (Step 202). Here, it is judged whether or not the first stage sequential circuit element closest to the input terminal (in this case, skew value sequential circuit element 17) is detected (Step 203). If detected, the first-stage sequential circuit element type, i.e., the type of flip-flop, etc., and the element name, i.e., the specific element name added within the net list, are stored (Step 204). Next, the presence or absence of a second-stage sequential circuit element located next to the first-stage sequential circuit element is judged (Step 205). If a second-stage sequential circuit element (in this case, 18) is detected, the first-stage sequential circuit element detected in Step 203 is specified as the sequential circuit element that is influenced by skew, thereby ending tracing of the net list, and the first-stage sequential circuit element type and element name are outputted from the storage contents of Step 204 (Step 208).

If either one of or both of combinatory logic 15 and 16 of the data-side and control-side are detected in Step 203 and a first-stage sequential circuit element not detected, and in addition, a second-stage sequential circuit element is not found in Step 205, the net list of the next stage is investigated (Step 206), and the processes of Steps 202–206 are repeated as long as a final-stage of the circuit is not reached. Tracing of the net list is forcibly ended for a path that reaches the final stage of a circuit (Step 207).

Next, element type information is extracted for the data outputted by undergoing the processes of Step 201–Step 207 (Step 208), this element type information is converted to a simulation library (hereinafter referred to as "skew value library") name that takes into consideration tester skew value fluctuations (Step 209), and is stored in the skew value library 4, only the element type for which the library name was rewritten in Step 209 is extracted from within skew value library 4 (Step 210), and the skew value library 4 extracted in Step 210 is then copied into normal library 5, thereby completing transcribing of specified skew value library 4 to normal library 5 (Step 211). Here, a skew value library has been prepared for specified sequential circuit element types in Steps 209–Step 211, and therefore, a relevant element name in the net list, i.e., the skew value sequential circuit element 17 of FIG. 5(A), is subsequently specified, this element name is substituted by library 4 to which has been added tester skew value fluctuation for the simulation of skew value sequential circuit element 17, and simulation is executed.

In other words, only the type name of specific elements matching the element name information of Step 208 are converted to skew value library names (Step 212), following which the simulation is executed (Step 213).

Explanation will next be given regarding the method of judging simulation results of Step 213.

Referring to FIG. 5(B) which shows timing specifications relating to skew value sequential circuit element 17 to which tester skew value fluctuation has been added, if these timing specifications are set such that the absolute value β of the prescribed tester skew value fluctuation range is applied to data signal input terminal 13 as +β and to control signal input terminal 14 as −α, the set-up time $t_{set-up}$ of skew value sequential circuit element 17 to which tester skew value fluctuation is added is:

$$t_{set-up} \geq (2\beta + \alpha)$$

if the set-up time specification for an element block is α as in the prior-art example.

In other words, if the operating timing relation relating to skew value sequential circuit element 17 satisfies $t_{set-up} \geq (2\beta+\alpha)$, the circuit operates normally despite the influence of tester skew, but a change of the above-described timing relation to $t_{set-up} < (2\beta+\alpha)$ indicates malfunctioning of the circuit, and this relation similarly applies to all detected sequential circuit elements. Accordingly, for the simulation results of Step 213, timing judgment is first carried out to determine whether or not $t_{set-up} < (2\beta+\alpha)$ (Step 214), following which the presence or absence of function errors is judged with respect to expected output values (Step 215), and in this way, malfunctioning due to tester skew (Step 216) or no effect from tester skew (Step 217) can be easily verified.

In addition, although the present embodiment takes set-up times to represent timing specifications, the effect of tester skew on hold time, release time, or remover time can also be detected by the same construction and procedures.

Figure 6:
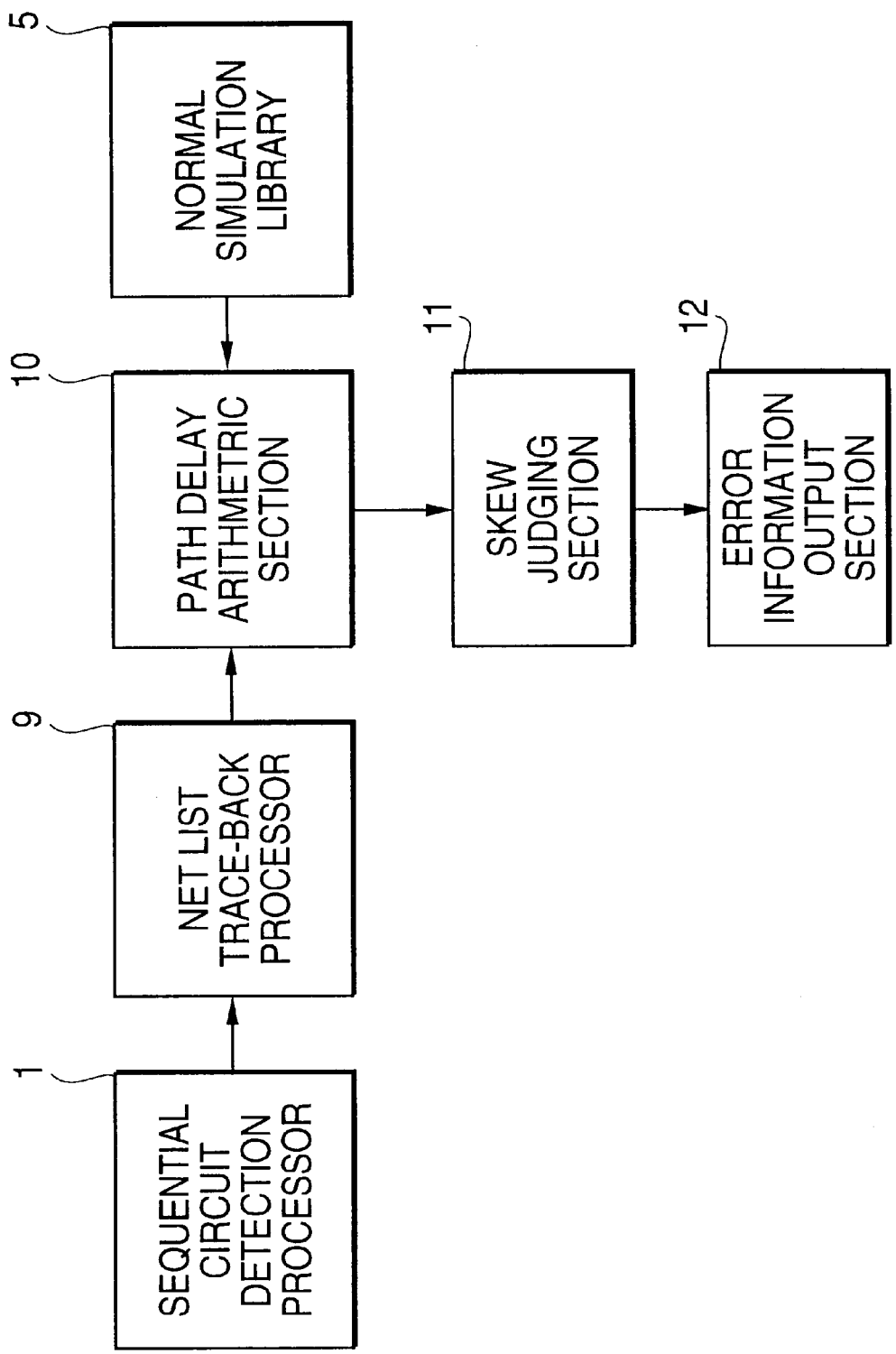
FIG. 6 is a block diagram showing the second embodiment of the simulation device of the present invention.

The second embodiment of the present invention will next be described with reference to FIG. 6, which shows a block diagram of the second embodiment in which constituent elements equivalent to those of FIG. 3 are identified by the same reference numerals. In place of memory circuit 2A, data substitution processor 3 and arithmetic section 6 of the first embodiment, this embodiment includes:

net list trace-back processor 9 that individually selects first-stage sequential circuit elements detected by sequential circuit detection processor 1 and traces back the net list in the direction of the input terminal of the object circuit of simulation from the input section of the one selected sequential circuit element;

path delay arithmetic section 10 that calculates the path delay up to the input terminal for the data signal and control signal paths specified by net list trace-back processor 9;

skew judging section 11 that compares data signal and control signal path delay values calculated by path delay arithmetic section 10 for all of the combinations of data and control signals; and error information output section 12 that indicates each input terminal name and delay difference between input terminals for combinations of data and control signals judged not to have tester skew margin by skew judging section 11.

By means of this construction, the simulation device of this embodiment can specify the input signal terminals and their input paths that influence the operation of the above-described first-stage sequential circuit element by back-tracing a net list from the input section of each element for each first-stage sequential circuit element located on the input terminal side that is extracted by means of the first embodiment, and moreover, can distinguish between data and control signals and independently calculate the delay values of specified input paths, calculate delay differences between each pair of input signals for all combinations of data and control input signals, and thereby enabling determination of whether a margin for tester skew exists between data signals and control signals.

In contrast with the first embodiment, which is a dynamic simulation that verifies state changes of elements using test patterns, this embodiment executes a static simulation that calculates delays by unconditionally tracing element state changes according to net list connections.

Figure 4:
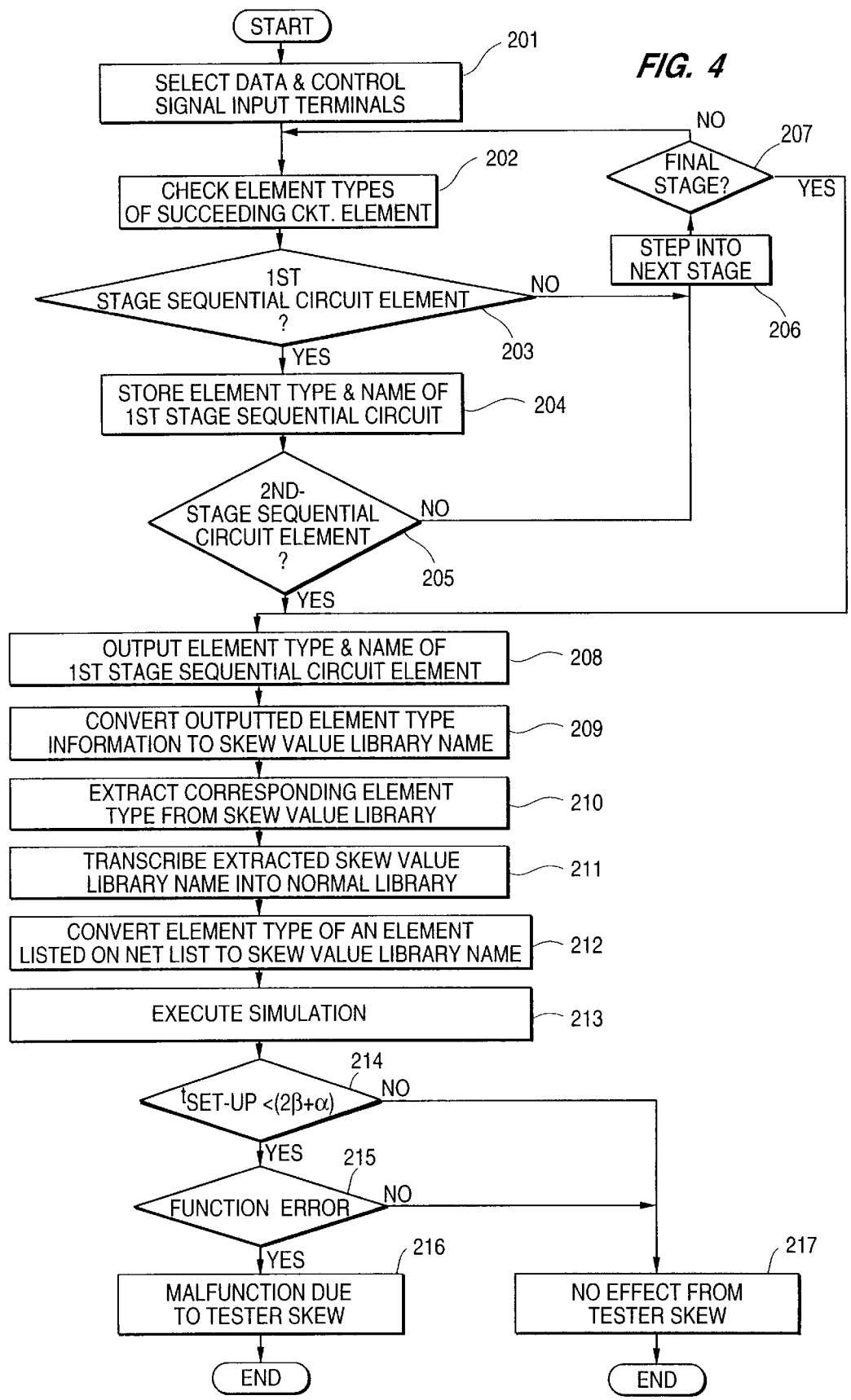
FIG. 4 is a flow chart illustrating the simulation method of the first embodiment.
Figure 7:
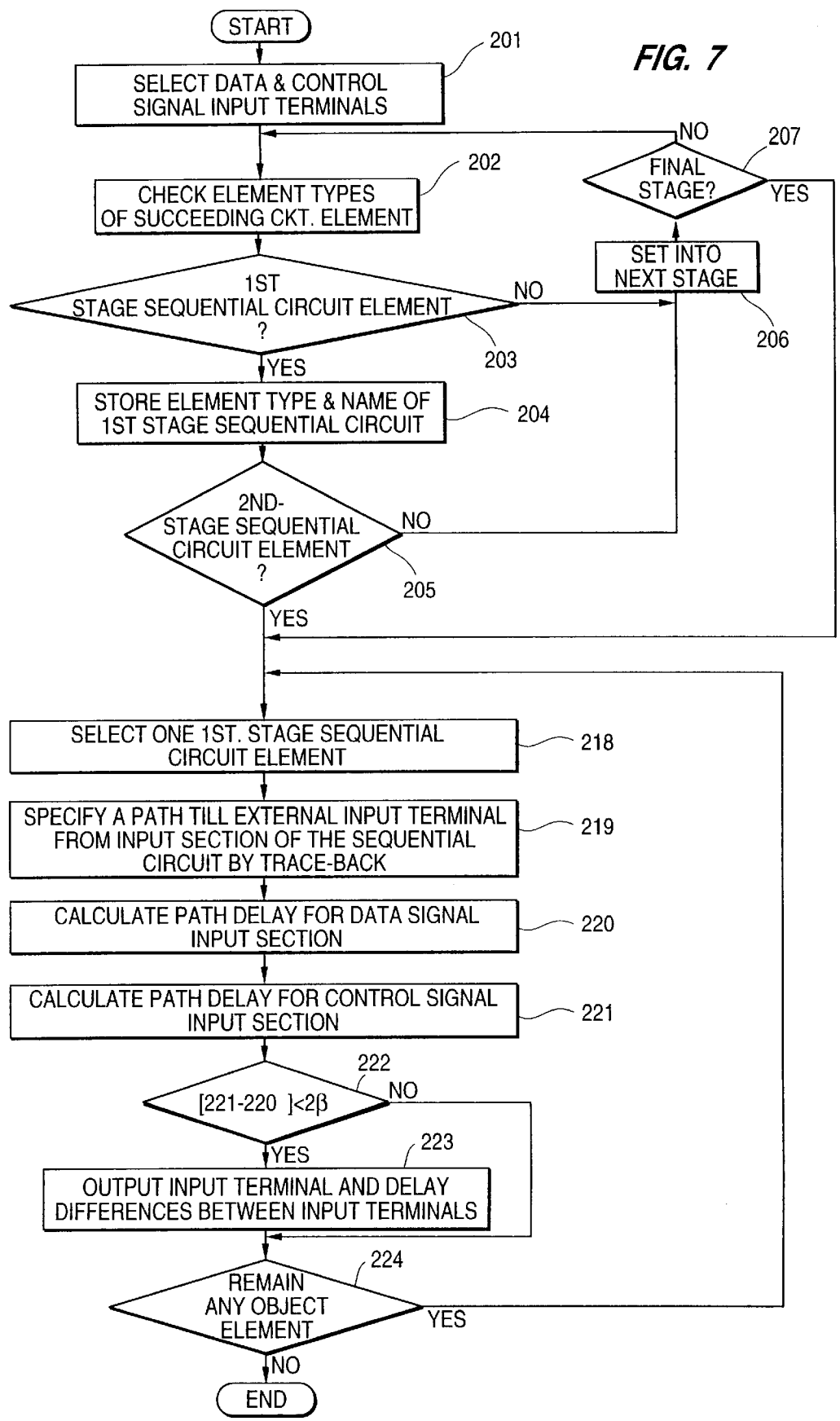
FIG. 7 is a flow chart illustrating the simulation method of the second embodiment.

The operation of the present embodiment will next be explained with reference to FIG. 6 and FIG. 7, which shows a flow chart of the process procedures in which constituent elements equivalent to those of FIG. 4 are similarly identified. First, Steps 201–207 are identical to those of the first embodiment described hereinabove, and explanation regarding these steps is therefore omitted. This explanation will begin with Step 218, in which one of the first-stage sequential circuit elements stored in Step 204 is selected (Step 218). The net list is traced back from the input section of this sequential circuit element, and a path reaching the external input terminal is specified (Step 219). Based on the trace-back results of Step 219, path delay for the data signal input section is calculated (Step 220), following which the path delay for the control signal input section is calculated (Step 221). The path delay values calculated in Steps 221 and Step 220 are each compared (Step 222) and if the path delay difference is twice the prescribed tester skew β, i.e., 2β or greater, the input timing relation will not invert even when the above-described two signals are in maximum conflict, the effect of tester skew can therefore be considered non-existent.

On the other hand, if the delay difference of the above-described two signals is less than 2β in Step 222, this delay difference indicates a potential for inversion of the input timing relation for a worst-case tester skew value fluctuation of 2β, and the judging result is the outputting of each of the input terminal names and actual delay differences between input terminals as errors due to insufficient skew margin (Step 223). After one round of the processes of Steps 218–223 has been completed, the presence or absence of a succeeding sequential circuit element is checked (Step 224), and the processes of Steps 218–223 are similarly repeated until no object element for investigation remains.

Accordingly, in the present embodiment, data signal and control signal inputs with a potential for being influenced by tester skew are detected as sets, the delay difference output process between these two input signals is exhaustively performed for inputs as required, thereby enabling a quantitative grasp of a circuit's operation margin for an unspecified combination of tester skew. These results can be reflected in circuit or test pattern design and are useful in preventing test trouble upon shipping.

If problems originating in testers can be assumed to account for 20% of all shipment testing problems for ASIC, the application of the first and second embodiments can realize a 20% reduction in shipment testing problems now and in the future, thereby eliminating tie-ups in shipment of both trial and volume products and allowing increased productivity.

As described hereinabove, the simulation device and method of the present invention is provided with a sequential circuit detection processing means that detects all first-stage sequential circuit elements and outputs sequential circuit element information, a skew value library for simulation use in which skew value fluctuation is added, and a data substitution means that transplants prescribed data of the above-described skew value library in a library and substitutes net list data; and detects all first-stage sequential circuit elements that may be directly influenced by skew in each data and control input signals; substitutes only these detected elements with simulation library supplemented by the amount of fluctuation in tester skew value; and judges timing for substituted elements; and as a result, numerous unspecified sources of malfunctioning in sequential circuits caused by tester skew value fluctuations that are undetectable in normal simulations can be checked at the time of circuit verification, thereby greatly reducing subsequent problems in the testing of ICs such as ASIC at the time of shipping.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method for simulating testing of a logic circuit, comprising:

determining a sequential element of a logic circuit for receiving an input data signal and an input control signal;

determining from a stored test pattern a time interval $\alpha$ between a rising edge of an ideal tester input control signal pulse and a next rising edge of an ideal tester input data signal pulse;

determining from stored skew value data a skew value fluctuation range $\beta$ for an input data signal and input control signal of logic circuit testers; and using as a set-up time for said element the quantity $(2\beta+\alpha)$.

2. The method claimed in claim 1, further comprising determining a control signal path delay for a signal path from a control signal input terminal of the logic circuit to a control signal input terminal of the sequential circuit element;

determining a data signal path delay for a signal path from a data signal input terminal of the logic circuit to a data signal input terminal of the sequential circuit element; and determining whether a difference between said control signal path delay and said data signal path delay exceeds said skew value fluctuation range.

3. An apparatus for simulating testing of a logic circuit, comprising:

means for determining a sequential element of a logic circuit receiving an input data signal and an input control signal;

means for determining from a stored test pattern a time interval $\alpha$ between a rising edge of an ideal tester input control signal pulse and a next rising edge of an ideal tester input data signal pulse;

means for determining from stored skew value data a skew value fluctuation range $\beta$ for an input data signal and an input control signal of logic circuit testers; and means for designating as a set-up time for said element the quantity $(2\beta+\alpha)$.

4. The apparatus for simulating claimed in claim 3, further comprising:

means for determining a control signal path delay for a signal path from a control signal input terminal of the logic circuit to a control signal input terminal of the sequential circuit element;

means for determining a data signal path delay for a signal path from a data signal input terminal of the logic circuit to a data signal input terminal of the sequential circuit element; and means for determining whether a difference between said control signal path delay and said data signal path delay exceeds said skew value fluctuation range.

* * * * *